United States Patent [19]
Matsuura et al.

[11] Patent Number: 5,726,994
[45] Date of Patent: Mar. 10, 1998

[54] ADDRESS MULTIPLEX SEMICONDUCTOR MEMORY DEVICE FOR ENABLING TESTING OF THE ENTIRE CIRCUIT OR FOR ONLY PARTIAL COMPONENTS THEREOF

[75] Inventors: Hiromi Matsuura, Tokorozawa; Masaya Muranaka, Akishima; Yasunori Orito, Ushiku, all of Japan

[73] Assignees: Hitachi, Ltd., Tokyo, Japan; Texas Instruments Incorporated, Dallas, Tex.

[21] Appl. No.: 608,616

[22] Filed: Feb. 29, 1996

Related U.S. Application Data

[62] Division of Ser. No. 214,214, Mar. 17, 1994, abandoned.

[30] Foreign Application Priority Data

Mar. 20, 1993 [JP] Japan ................ 5-085576

[51] Int. Cl.$^6$ .................. G11C 7/00; G11C 29/00
[52] U.S. Cl. ............... 371/21.1; 371/21.2; 365/201
[58] Field of Search .................. 371/21.1, 21.2, 371/22.5, 22.6, 24; 365/200, 201

[56] References Cited

U.S. PATENT DOCUMENTS

| | | | |
|---|---|---|---|
| 4,599,709 | 7/1986 | Clemons | 365/200 |
| 4,744,061 | 5/1988 | Takemae et al. | 365/201 |
| 5,109,360 | 4/1992 | Inazumi et al. | 365/200 |
| 5,185,744 | 2/1993 | Arimoto et al. | 371/21.2 |
| 5,255,227 | 10/1993 | Haeffele | 365/200 |
| 5,293,386 | 3/1994 | Muhmenthaler et al. | 371/21.1 |
| 5,299,161 | 3/1994 | Choi et al. | 365/201 |
| 5,355,342 | 10/1994 | Ueoka | 365/201 |

*Primary Examiner*—Hoa T. Nguyen
*Attorney, Agent, or Firm*—Antonelli, Terry, Stout, & Kraus, LLP

[57] ABSTRACT

A memory array is logically and/or physically divided into a plurality of blocks to allow test by individual blocks. When a plurality of column address strobe signals are provided and memory accessing is made by a plurality of bits to the memory array corresponding to the column address strobe signal, tests are independently conducted for each memory array by using the column address strobe signal.

6 Claims, 12 Drawing Sheets

ADDRESS MULTIPLEX SEMICONDUCTOR MEMORY DEVICE FOR ENABLING TESTING OF THE ENTIRE CIRCUIT OR FOR ONLY PARTIAL COMPONENTS THEREOF

This application is a Continuation Division of application Ser. No. 08/214,214, filed Mar. 17, 1994 now abandoned.

BACKGROUND OF THE INVENTION

FIELD OF THE INVENTION

The present invention relates to a random access memory (RAM), and more particularly to a technology effectively useful in the testing of a multi-bit dynamic RAM.

As the storage capacity of a dynamic RAM increases, a test method requires reading and writing of 16-bit or 64-bit data in a 1-bit compressed form in an internal circuit to thereby prevent any increase in testing time. An example of a dynamic RAM having such a test circuit by multi-bits is disclosed in JP-A-3-214669.

Prior art test circuits are primarily designed from the view point of efficiently reducing the testing time.

In the dynamic RAM in which the expansion of the storage capacity and the reduction of the chip size are being accelerated, components are rendered more and more fine and the wiring is more and more multi-layered and hence an operation margin is more and more severe. The inventors of the present invention have noticed that not only the reduction of the testing time is required for the test circuit but also delicate evaluation of characteristics of circuits and components are required.

SUMMARY OF THE INVENTION

It is therefore an object of the present invention to provide a dynamic RAM having a test circuit which allows versatile tests for the entire circuit or for partial components.

Typical features of the present invention are briefly explained below. A memory array is divided into a plurality of blocks, either logically and/or physically, to allow a test by blocks. When a plurality of column address strobe signals are provided and memory access is made of a plurality of bits at a time for a memory access corresponding to a column address strobe signal, a test is made independently for each memory array corresponding to the column address strobe signal by utilizing the column address strobe memory.

In the memory device of the present invention, column address signals are divided into two signal groups, including a first column address signal and second column address signal, for supply to the memory device, and these column address signals are taken into the memory device in accordance with the first column address strobe signal and the second column address strobe signal, respectively. Further, information of memory cells selected based on the first column address signals can be subject to data compression testing by a first compression circuit, and information of memory cells selected based on the second column address signals can be subject to data compression testing by a second compression circuit.

In accordance with the features described above, since the test is made for the logically and/or physically divided memory array group, the delicate evaluation and the defect analysis can be made using a smaller number of samples.

Figure 12:
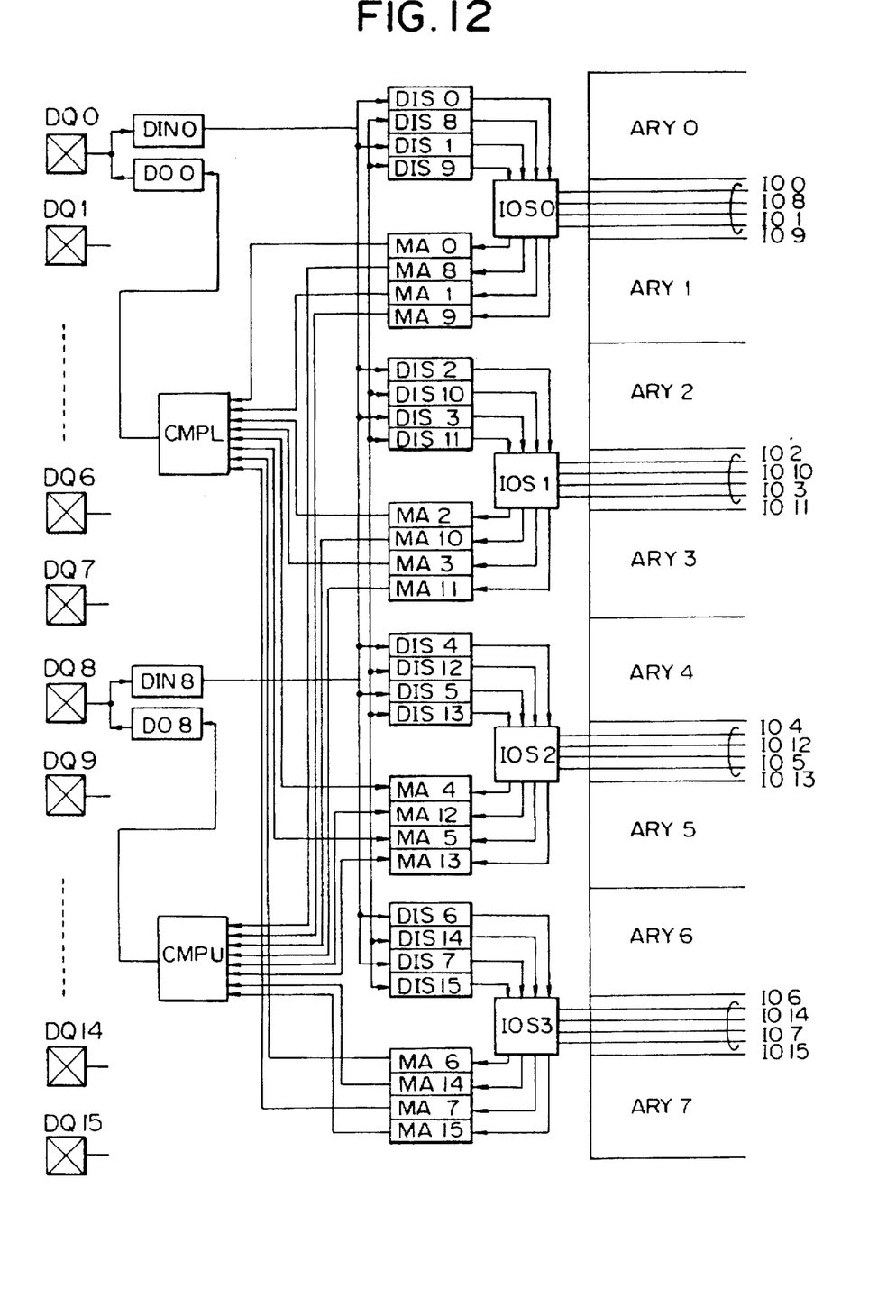
FIG. 12 shows a block diagram of another embodiment of the input/output unit of the dynamic RAM of the present invention.

According to the attached embodiments, the physical division of the array is shown in FIGS. 1, 2, 4 and 8–10. The logical division of the array is shown in FIG. 12. The logical and physical division of the array is attained by applying a test mode, by which a block selected in the array is tested and which is controlled in response to an address signal or a data signal, to the physically divided array.

BRIEF DESCRIPTION OF THE DRAWINGS

These and other objects and technical advantages of the present invention will be readily apparent from the following description of the preferred exemplary embodiments of the invention in conjunction with the accompanying drawings, in which.

DESCRIPTION OF THE PREFERRED EMBODIMENTS

Figure 1:
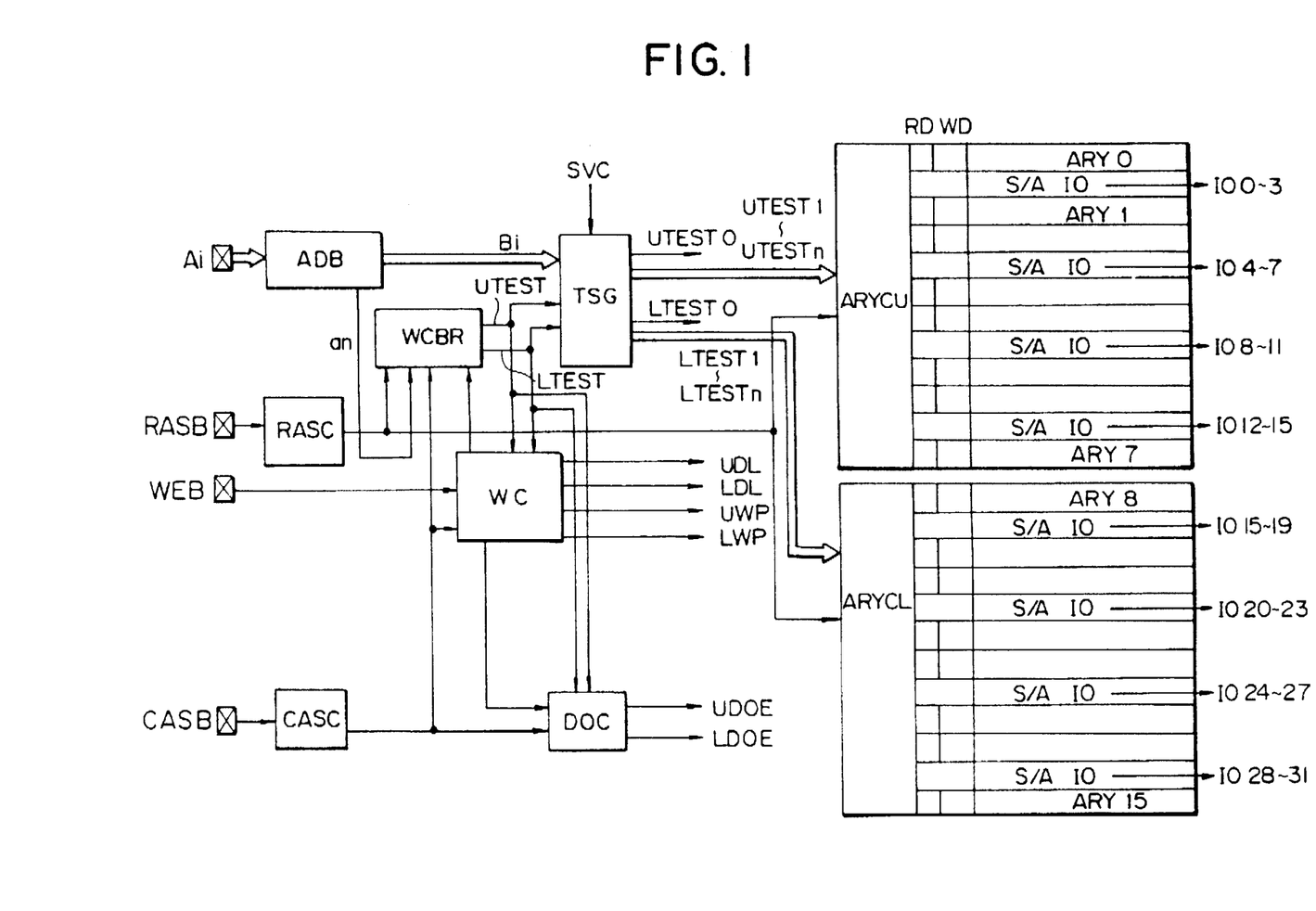
FIG. 1 shows a block diagram of major parts of one embodiment of a dynamic RAM of the present invention.

FIG. 1 shows a block diagram of major parts of one embodiment of a dynamic RAM of the present invention. The block diagram of FIG. 1 is depicted to primarily show a test circuit, and an input circuit and an output circuit of data are omitted. The circuit blocks of FIG. 1, together with other peripheral circuits including the omitted input circuit and output circuit are formed on one semiconductor substrate such as single crystal silicon by a known semiconductor integrated circuit fabrication technique. For the peripheral circuit, a dynamic RAM (Type: HM5116400A) marketed by Hitachi Ltd. may be used.

An address signal Ai is a multi-bit address signal. A row address signal and a column address signal are supplied in a multiplexed manner. A row address strobe signal RASB is a timing signal to read in the row address signal and it is read into a RAS clock unit RASC. A column address strobe signal CASB is a timing signal for reading the column address signal and it is read into a CAS clock unit CASC. A write enable signal WEB instructs a write operation in a normal mode. When it is in a low level, it instructs a write operation, and when it is in a high level, it instructs a read operation. It is read into a write clock unit WC.

A logic circuit WCBR receives the address strobe signals RASB and CASB and the write enable signal WEB, and when it detects the low levels of both the CASB signal and the WEB signal at the timing of the change of the row address strobe signal RASB from the high level to the low level, it sets a test mode.

In the present embodiment, the memory array is divided into two parts, an upper part and a lower part, to allow independent testing of the respective parts. Thus, in setting the test mode, an address signal "an" is used to specify the upper array or the lower array. The address signal "an" is a 2-bit address signal, although it is not restrictive, which comprises a 1-bit address signal corresponding to the upper memory array and a 1-bit address signal corresponding to the lower memory array. By a combination of the 2-bit address signal, either one of the upper memory array and the lower memory array can be tested alone or the upper memory array and the lower memory array can be simultaneously tested. Instead of the address signal "an", a data signal which is supplied through an input line, not shown, may be used to specify one of the upper memory array and the lower memory array.

The logic circuit WCBR generates a test set signal UTEST for the upper memory array and a test set signal LTEST for the lower memory array in accordance with the combination of the address signal "an" and the clock signals RASB, CASB and WEB.

For the independent test of the upper memory array and the lower memory array, the test set signals UTEST and LTEST are also supplied to a write clock unit WC. In the test mode, the write clock unit WC generates a data latch signal UDL and a write pulse UWP for latching write data for the upper memory array, and a data latch signal LDL and a write pulse LWP for latching write data for the lower memory array. In a normal mode, the signals UDL and LDL and the signals UWP and LWP are generated at the same time and are regarded as essentially one signal, respectively.

The test set signals UTEST and LTEST are also supplied to a data out control unit DOC for the independent tests of the upper memory array and the lower memory array. In the test mode, the data out control unit DOC generates an output buffer enable signal UDOE for outputting read data corresponding to the upper memory array and an output buffer enable signal LODE for outputting read data corresponding to the lower memory array. In the normal mode, the signals UDOE and LDOE are simultaneously generated and they are regarded as essentially one control signal. A control signal instructing the read mode is supplied from the write clock WC to the data out control unit DOC, which generates the signals UDOE and LDOE.

A test signal generation circuit TSG is enabled by the test set signals UTEST and LTEST, and generates test mode signals UTEST0–UTESTn and LTEST0–LTESTn by using an address signal Bi supplied from an address buffer ADB as a key. Types of the test mode include a write mode and a read mode in which multi-bits are compressed into one bit as will be explained later, as well as a mode in which a plate voltage of the memory array is switched, a mode in which an internal voltage is switched to an external voltage, and a mode which responds to a configuration and a function of an internal circuit of the dynamic RAM such as an internal voltage monitor or a refresh counter test.

The test function includes a test mode which is not opened to a user and an open test mode which may be implemented by the user. SVC is used to set the test mode which is not opened to the user, by supplying a high voltage to a power supply from a specific terminal. In order to prevent the user from inadvertently implementing the non-open test mode in which the internal data may be destroyed, the non-open test mode is initiated under the condition of the higher voltage SVC than the power supply voltage at the specific terminal in addition to the setting of the test mode by WCBR.

An array control unit ARYCU for the upper memory array receives a signal from an RAS clock unit RASC to conduct a basic operation such as driving of sense amplifiers S/A for the memory arrays ARY0–ARY7. RD is a row address decoder and WD is a word line driver. The array control unit ARYCU has a program for implementing the test mode, and implements the test mode when the test mode signals UTEST0–UTESTn generated by the test signal generation circuit TSG are supplied.

In the present embodiment, the test mode is selected in accordance with the address signal. Instead of the address signal, a data signal which is supplied through an input line, not shown, may be used to select the test mode.

Similarly, an array control unit ARYCL for the lower memory array receives a signal from the RAS clock unit RASC and conducts a basic operation such as driving of sense amplifiers S/A corresponding to the memory arrays ARY8–ARY15. RD is a row address decoder and WD is a word line driver. The test mode signals LTEST0–LTESTn generated by the test mode signal generation circuit TSG are supplied to the array control unit ARYCL, which implements various test modes.

Of the test mode signals UTEST0–UTESTn and LTEST0–LTESTn, the signals UTEST0–LTEST0 are used for the bit compression test and they are also used for the control of the input/output circuit, as will be described in conjunction with FIG. 4. The remaining test mode signals UTEST1–UTESTn and LTEST1–LTESTn control the array control units ARYCU and ARYCL. For example, they switch the plate voltage to allow for an independent memory cell stress test of the upper memory array and the lower memory array and simultaneous comparison of data before and after the application of the stress.

Furthermore, a part or parts of the array are subjected to one of the above-mentioned test modes by means of a specific test mode by which the array is divided logically into a plurality of blocks.

A method for efficiently conducting a test is disclosed in JP-A-3-214669 and counterpart U.S. application Ser. No. 07/424,904, filed on Oct. 18, 1989, U.S. application Ser. No. 07/899,572 filed on Jun. 18, 1992 and its divisional application filed on Nov. 11, 1993, which are incorporated herein by reference.

Figure 2:
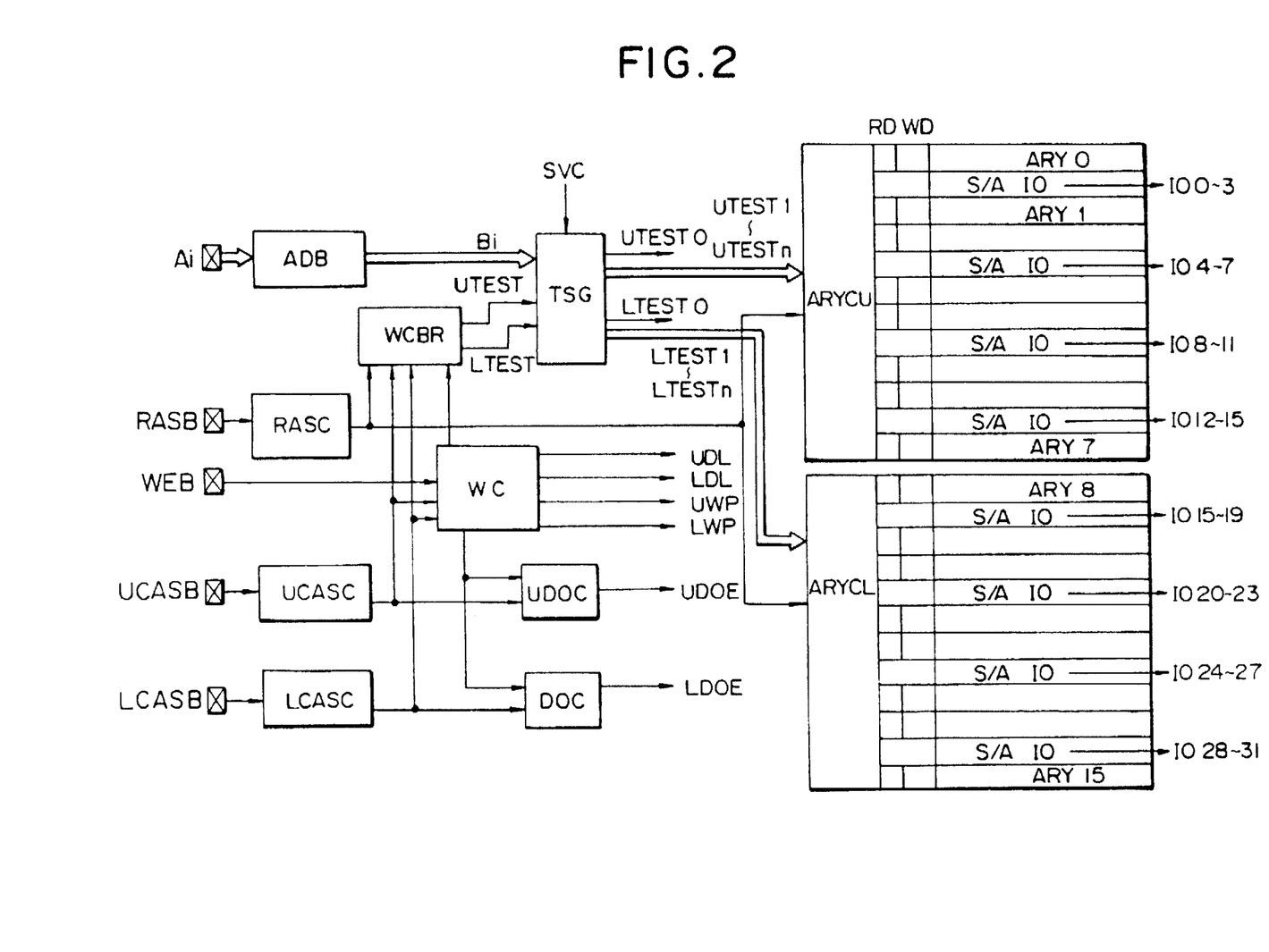
FIG. 2 shows a block diagram of major parts of another embodiment of the dynamic RAM of the present invention.

FIG. 2 shows a block diagram of major parts of another embodiment of the dynamic RAM of the present invention. The block diagram of FIG. 2 depicts primarily a test circuit and an input circuit and an output circuit for data are omitted. Circuit blocks of FIG. 2 together with other peripheral circuits including the omitted input circuit and output circuit are formed on one semiconductor substrate such as single crystal silicon by a known semiconductor integrated circuit fabrication technique.

The dynamic RAM of the present embodiment has a large memory capacity of approximately 64M bits, although it is not restrictive. In the dynamic RAM having such a large memory capacity, if accessing is made bit by bit, the address space is too large and its utility is lost. Thus, the memory access is conducted by plural bits such as 8 bits or 16 bits. In order to allow the connection to an 8-bit bus or a 16-bit bus without modifying the internal circuit, two column address strobe signals are provided to conduct the memory address by 8 bits for the respective signals.

The internal circuit including the memory array is physically divided into two blocks to correspond to the two column address strobe signals UCASB and LCASB and the memory access is conducted to the respective blocks. For example, the signals UCASB and LCASB are selectively supplied to conduct the memory access by 8 bits so that they may be connected to the 8-bit bus. Of 16-bit data terminals comprising DQ0–DQ15, the data terminals DQ0–DQ7 and DQ8–DQ15 are connected in common, respectively.

By simultaneously supplying the signals UCASB and LCASB, the memory access by 16 bits is attained and the 16-bit data terminals comprising DQ0–DQ15 are connected to the 16 data buses, respectively.

Two CAS clock units are provided for the above memory access. Namely, a CAS clock unit UCASC corresponding to the column address strobe signal UCASB for specifying the upper 8-bit data DQ8–DQ15 of the 16-bit data, and a CAS clock unit LCASC corresponding to the column address strobe signal LCASB for specifying the lower 8-bit data DQ0–DQ7 of the 16-bit data are provided.

The internal clocks generated by the CAS clock units UCASC and LCASC are supplied to the data out control units UDOC and LDOC for the respective clocks to generate control signals UDOE and LDOE for outputting independent data of the upper memory array and the lower memory array. Similarly, they are also supplied to the write clock unit WC which generates control signals UDL/LDL for independently writing data to the upper memory array and the lower memory array.

In the present embodiment, the internal clocks generated by the two CAS clock units UCASC and LCASC are also supplied to the logic circuit WCBR which sets the test mode, by utilizing the above memory access so that independent tests are conducted for the upper memory array and the lower memory array. Namely, to independently test the two-divided memory array, the two column address strobe signals UCASB and LCASB are used instead of using the address signal "an" so that the operation paths and logic in the normal mode can be used as they are. Other configurations are similar to that of the embodiment of FIG. 1, but the explanation thereof is omitted.

Figure 3:
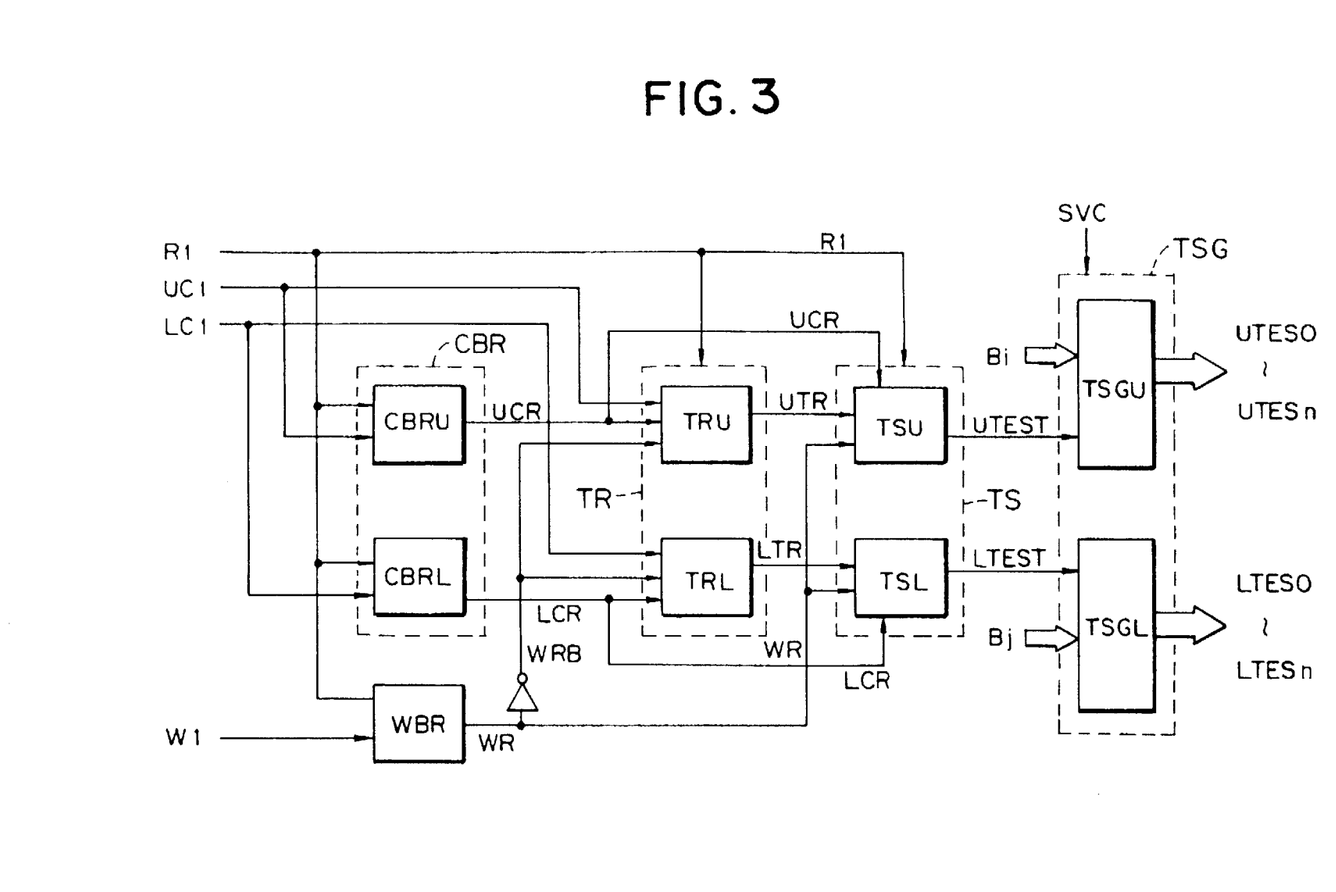
FIG. 3 shows a block diagram of one embodiment of a logic unit WCBR and a test signal generation circuit TSG corresponding to the embodiment of FIG. 2.

FIG. 3 shows a block diagram of an embodiment of the logic unit WCBR and the test signal generation circuit TSG corresponding to the embodiment of FIG. 2. The logic circuit CBR comprises two logic circuits CBRU and CBRL. The logic circuit CBRU determines the low level of the signal UCASB at the time of changing the signal RASB from the high level to the low level by an RAS basic clock R1 (an inverted signal of the row address strobe signal RASB, see FIG. 6) and an upper CAS basic clock UC1 (an inverted signal of the upper column address strobe signal UCASB, see FIG. 6), to produce a signal UCR. Namely, the output signal UCR is at the high level if the signal UC1 is at the high level at the time of changing the signal R1 from the low level to the high level. The logic circuit CBRL determines the low level of the signal LCASB at the time of changing of the signal RASB from the high level to the low level by the RAS basic clock R1 and the lower CAS basic clock LC1 (an inverted signal of LCASB), to produce a signal LCR. Namely, the output signal LCR is at the high level if the signal LC1 is at the high level at the time of changing the signal R1 from the low level to the high level.

The logic circuit WBR determines the low level of the signal WEB at the time of changing the signal RASB from the high level to the low level by the RAS basic clock R1 and a WE basic clock W1 (an inverted signal of the write enable signal WEB), to produce a signal WR. Namely, the output signal WR is at the high level if the signal WR is at the high level at the time of changing the signal R1 from the low level to the high level.

The test set circuit TS comprises a logic circuit TSU which receives the output signal UCR of the logic circuit CBRU and the output signal WR of the logic circuit WBR, and a logic circuit TSL which receives the output signal LCR of the logic circuit CBRL and the output signal WR of the logic circuit WBR, and produces test set signals UTEST and LTEST by a timing of WCBR generated for the two-channel UCASB and LCASB.

The test reset circuit TR comprises a logic circuit TRU which receives the output signal UCR of the logic circuit CBRU and an inverted output signal WRB of the logic circuit WBR, and a logic circuit TRL which receives the output signal LCR of the logic circuit CBRL and the inverted output signal WRB of the logic circuit WRB, and determines a CBR timing generated for the two-channel UCASB and LCASB to produce test reset signals UTR and LTR to reset the test set circuit TS. It also determines the RAS only by the RAS basic clock R1 and the CAS basic clocks UC1 and LC1 to reduce the test reset signals UTR and LTR to reset the test set circuit TS.

The test signal generation circuit TSG comprises a test signal generation circuit TSGU for generating test mode signals UTEST0–UTESTn corresponding to the upper bit memory array and a test signal generation circuit TSGL for generating test mode signals LTEST0–LTESTn corresponding to the lower bit memory array. The test signal generation circuits TSGU and TSGL generate the test mode signals by using the address signals Bi and Bj as keys when the test set signals UTEST and LTEST are generated. A test mode which is not open to the user is enabled by supplying the high voltage SVC.

In the logic circuit WCBR, the logic circuit is configured for the two CAS clock signals UCASB and LCASB so that the tests for the upper bit memory array and the lower bit memory array can be conducted either completely separately and independently or simultaneously.

Where two channels of WE clocks are provided in addition to the two channels of CAS clocks in the present embodiment, the tests may be independently conducted by using the two-channel WE clocks.

Figure 4:
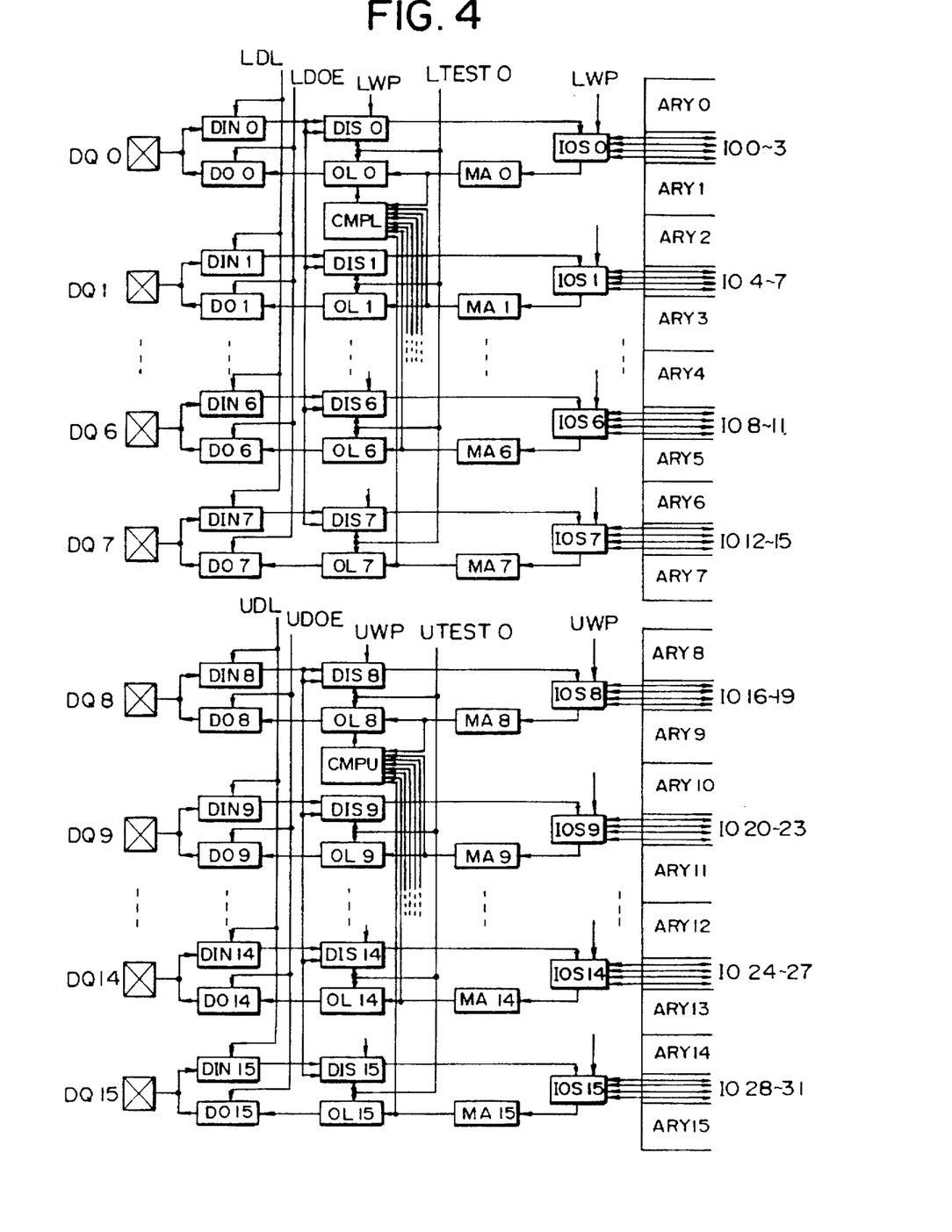
FIG. 4 shows a block diagram of one embodiment of an input/output unit in the dynamic RAM of the present invention.

FIG. 4 shows a block diagram of one embodiment of an input/output unit of the dynamic RAM of the present invention. In FIG. 4, four circuits are illustrated for the lower bits and the upper bits, respectively.

The circuit for the lower 8 bits includes data terminals DQ0, DQ1, DQ6 and DQ7 of the data terminals DQ0–DQ7 and four data terminals DQ2–DQ5 are omitted. The memory cell arrays are also omitted for the omitted data terminals DQ2–DQ5. In particular, one pair of memory arrays are provided for one data terminal, and 16 memory cell arrays in total are present for the lower 8 bit, but 8 of them are omitted in FIG. 4, and 8 arrays ARY0–ARY7 are shown.

Four pairs of input/output lines IO0–IO3 are provided between adjacent pair of memory cell arrays such as the memory cell arrays ARY0 and ARY1. In FIG. 4, one line represents a pair of complementary input/output lines. A sense amplifier is a shared sense amplifier although it is not restrictive, and it is selectively used by the pair of memory cell arrays.

One of the four pairs of input/output lines IO0–IO3 is selected by an IO selection circuit IOS0 and is connected to a data input selection circuit DIS0 by the signal LWP for the write operation, and connected to a main amplifier MA0 for the read operation.

The data input selection circuit DIS0 is enabled by a write pulse LWP and switches a data path for the normal mode and the test mode by the test mode signal LTEST0. Namely, in the normal mode, it conveys the data from the data input buffer DIN0 corresponding to the data terminal DQ0, and in the test mode, it conveys the data from the data input buffer DIN0 which is compressed to one bit. The data input selection circuit DIS0 corresponding to the compressed bit conducts the same selection operation in the normal mode and the test mode LTEST0, but the other data terminals DQ1–DQ7 select data from the corresponding data input buffers DIN1–DIN7 in the normal mode and select data of the compacted 1-bit data input buffer DIN0 in the test mode LTEST0. The data input buffers DIN0–DIN7 read the write data supplied by the data latch signal LDL.

The output signals of the main amplifiers MA0–MA7 are supplied, on one hand, to the data output latches OL0–OL7, which read the data of the corresponding main amplifiers in the normal mode and then output them. On the other hand, in the test mode LTEST0, they inhibit the propagation of the output except the circuit OL0 corresponding to the compressed bit.

The data output latch OL0 corresponding to the compressed bit conveys the output signal from the data compression circuit CMP to the data output buffer DO0 and outputs it from the data terminal DQ0. The data compression circuit CMPL compares the 8-bit data of the main amplifiers MA0–MA7 to produce match/mismatch signals. Namely, if the 8-bit read data matches, it produces a match signal, and if even one bit mismatches, it produces a mismatch signal.

In the circuit corresponding to 8 bits, data terminals DQ8, DQ9, DQ14 and DQ15 of the data terminals DQ8–DQ15 for four circuits are illustrated and DQ10–DQ13 are omitted. The memory cell arrays for the omitted data terminals DQ10–DQ13 are also omitted. In particular, one pair of memory cell arrays are provided for one data terminal, and 16 memory arrays in total are present for the upper 8 bits, but 8 of them are omitted in FIG. 4 and 8 arrays ARY8–ARY15 are shown.

For the upper 8 bits, IO selection circuits IOS8–IOS15, data input selection circuits DIS8–DIS15, data output latches OL8–OL15 and a data reduction circuit CMPU are provided. The signal path is switched in accordance with the normal mode and the test mode UTEST0 in the same manner as that described above.

In the embodiment of FIG. 1, the test mode and the normal mode may be implemented by similar circuits although methods for preparing the test mode signal are different. In the normal mode, however, only the memory access by 16 bits is permitted.

In the embodiments of FIGS. 1 and 2, the upper and lower memory cell arrays are divided into 8 blocks ARY0–ARY7 and ARY8–ARY15, respectively. Accordingly, when the memory access by the 8 bits is to be conducted in the embodiments of FIGS. 1 and 2, two pairs of the four pairs of input/output lines IO0–IO3 are to be selected, respectively. When the four pairs of input/output lines IO0–IO3 are simultaneously selected, the memory access by 16 bits for the upper and lower memory cell arrays is permitted, and when only one pair is selected, the memory access by the four bits is permitted. The unit of memory access for the upper or lower memory cell arrays may assume various forms.

Figure 5:
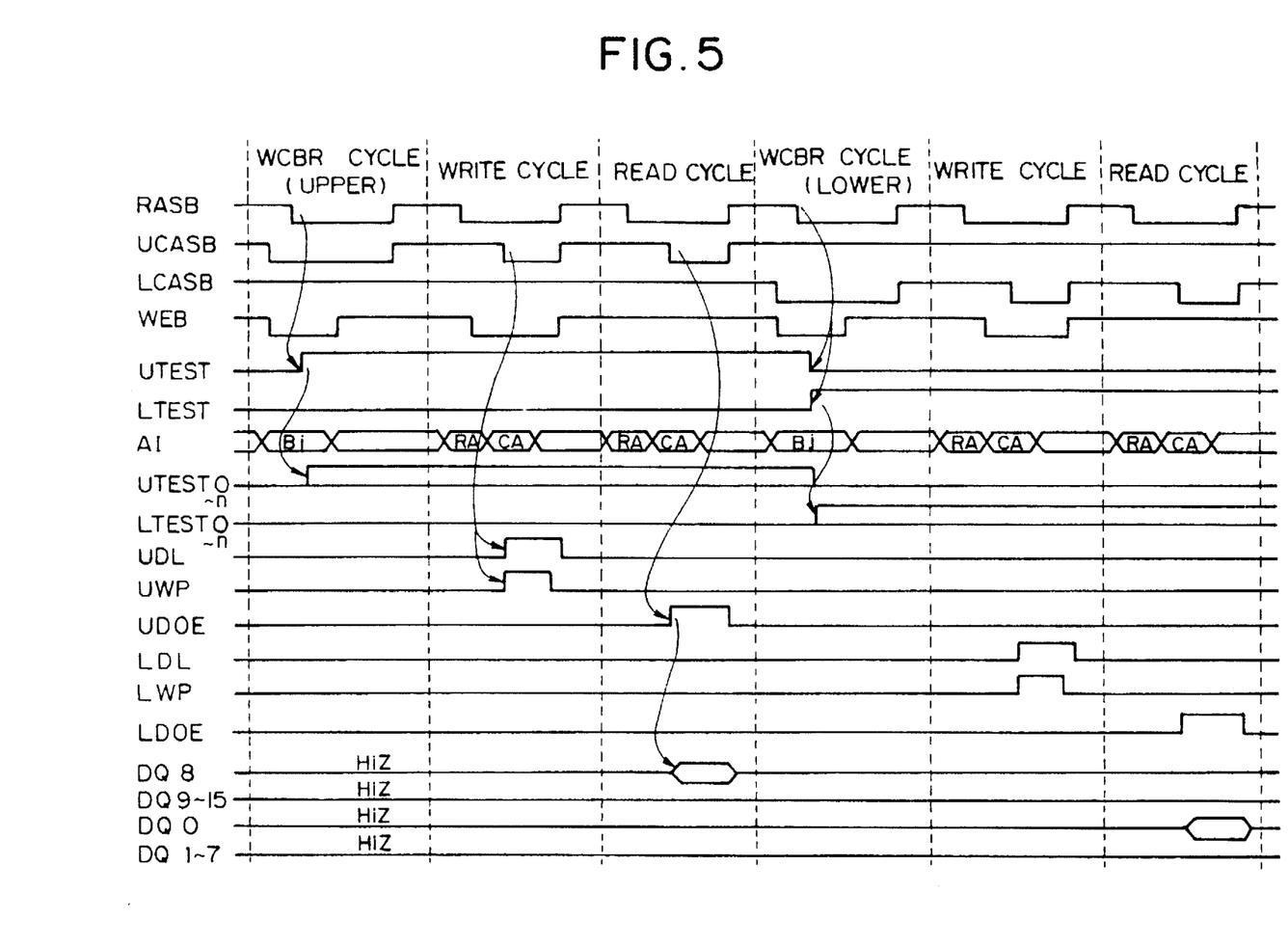
FIG. 5 shows a timing chart for illustrating operations in the circuits of the embodiments of FIGS. 2 and 4.

FIG. 5 shows a timing chart for illustrating an operation of the embodiments of FIGS. 2 and 4. In FIG. 5, in first three cycles, the upper array is in the test mode and the lower array is in a stand-by mode, and in the latter three cycles, the upper array is in the stand-by mode and the lower array is in the test mode.

The first cycle is a WCBR cycle in which the signals UCASB and WEB are rendered low level before the signal RASB is rendered low level, and the test set signal UTEST is generated by the WCBR timing. The address signal Bi supplied at that timing is read and used as a key to generate one of n+1 test mode signals UTEST0–UTESTn.

The second cycle is a write cycle in which the address signals RA and CA are read by the signals RASB and UCASB, and the signal WEB is rendered low level and writing to a specified memory address is conducted. Signals UDL and UWP are generated in response to the change of the signal UCASB to the low level and the write circuit is enabled to conduct the write operation in the specified test mode. For example, when the test mode signal UTEST0 is generated, the data supplied from the data terminal DQ8 are written into the memory cells corresponding to other data terminals DQ9–DQ15. Namely, the same 8-bit data is written.

The third cycle is a read cycle in which the address signals RA and CA are read by the signals RASB and UCASB and the signal WEB is rendered high level and the read operation from the specified memory address is conducted. A signal UDEO is generated in response to the change of the signal UCASB to the low level and the read circuit is enabled to conduct the read operation in the specified test mode. For example, when the test mode signal UTEST0 is generated, the 8-bit read data are compared by the data reduction circuit CMPU and match/mismatch signals are produced from the data terminal DQ8.

The fourth cycle is a WCBR cycle in the lower array in which the signals LCASB and WEB are rendered low level before the signal RASB is rendered low level and the test set signal LTEST is generated by the WCBR timing. The address signal Bi supplied at that timing is read and used as a key to generate one of the n+1 test mode signals LTEST0–LTESTn. Since the signal UCASB is left at the high level, only the RAS is detected for the upper array, and the test set signal UTEST is reset. Thus, the upper array enters into the stand-by mode.

The fifth cycle is a write cycle in which the address signals RA and CA are read by the signals RASB and LCASB and the signal WEB is rendered low level and the write operation to the specified memory address is conducted. The signals LDL and LWP are generated in response to the change of the signal LCASB to the low level, and the write circuit is activated to conduct the write operation in the specified test mode. For example, when the test mode signal LTEST0 is generated, the data supplied from the data terminal DQ0 is written into the memory cells corresponding to other data terminals DQ1–DQ7. Namely, the same 8-bit data is written.

The sixth cycle is a read cycle in which the address signals RA and CA are read by the signals RASB LCASB and the signal WEB is rendered high level and the read operation from the specified memory address is conducted. The signal LDOE is generated in response to the change of the signal LCASB to the low level and the read circuit is activated to conduct the read operation in the specified test mode. For example, when the test mode signal LTEST0 is generated, the 8-bit read data are compared by the data reduction circuit CMPL and the match/mismatch signals are produced from the data terminal DQ0.

It is seen that both may be set to the test mode by rendering the signals LCASB and UCASB to low level in the WCBR cycle. The upper array and the lower array may be set in different test modes. For example, if the address signals Bi and Bj are of different patterns, the corresponding test modes may be set.

When the signal WEB is low level, write signals UDL/LDL and UWP/LWP are generated in response to the fall of the signals UCASB/LCASB. When the signal WEB is changed the low level after the fall of the signals UCASB/LCASB (delayed write or read modified write), write signals UDL/LDL and UWP/LWP are generated in synchronism therewith. The signals UDOE/LDOE are generated during the period from the fall of the signals UCASB/LCASB to the change of the signal WEB to the low level, to output the data.

Figure 6:
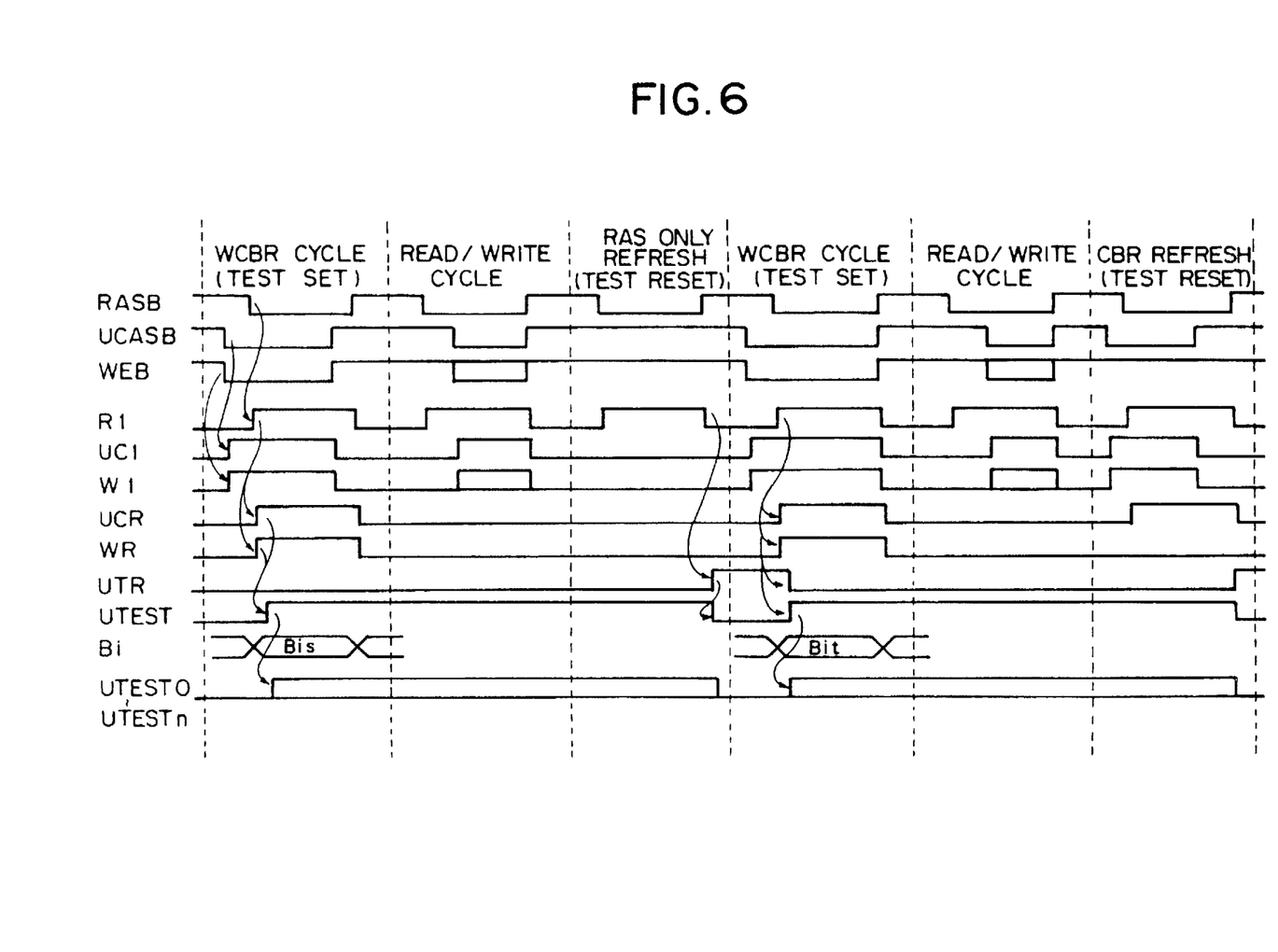
FIG. 6 shows a timing chart for illustrating an operation of the circuit of the embodiment of FIG. 3.

FIG. 6 shows a timing circuit for illustrating an operation of the circuit of the embodiment of FIG. 3. In FIG. 3, only the upper circuit is shown and the lower circuit is identical.

The first cycle is a WCBR cycle in which a test mode is set. Namely, the signal UC1 is rendered high level by the fall of the signal UCASB and the signal W1 is rendered high by the fall of the signal WEB. The signal R1 is rendered high level in response to the fall the signal RASB and the levels of the signals UC1 and W1 are determined at a rising edge of the signal R1. If both are high level, the signals UCR and WR are rendered high level and the test set signal UTESR is rendered high level by the high level of those two signals. The address signal Bis is identified by the test set signal UTEST so that one test mode signal is generated.

The second cycle is a read/write cycle in which a row address is read by the signal RASB, a column address is read by the signal UCASB, a write signal is generated if the signal WEB is low level and a read signal is generated if the signal WEB is high level.

The third cycle is a RAS only refresh cycle, in which the test reset is conducted. Namely, only the signal RASB is rendered low level while the signal UCASB is left at the high level, and it is reset to high level at the end of the cycle so that the signal URT is generated at the fall of the signal R1 and the test set signal UTEST is reset to low level.

The fourth cycle is a WCBR cycle in which test set is conducted. Namely, the signal UC1 is rendered high level by the fall of the signal UCASB and the signal W1 is rendered high level by the fall of the signal WEB. The signal R1 is rendered high level by the fall of the signal RASB, and the signals UC1 and W1 are determined by the rising edge of the signal R1. If both are at the high level, the signals UCR and WR are rendered high level and the signal UTR is rendered low level by the high level of the two signals and the test set signal UTESR is rendered high level. The address signal Bit is identified by the test signal UTEST and one test mode signal is generated.

The fifth cycle is a read/write cycle like the second cycle in which a row address is read by the signal RASB, a column address is read by the signal UCASB, and if the signal WEB is low level, a write signal is generated, and if it is high level, a read signal is generated.

The sixth cycle is a CRB refresh cycle in which test reset is conducted. Namely, the signal UCASB is rendered low level before the signal RASB is rendered low level to refresh CBR, and when a signal UCR is detected at the fall of the signal R1 at the end of the cycle, the signal UTR is generated and the test signal UTEST is reset to low level.

In the lower circuit, the signal UCASB is replaced by the signal LCASB and the corresponding upper circuit signals are replaced by the signals LC1, LCR, LYR, LTEST and LTEST0–LTESTn.

Figure 7:
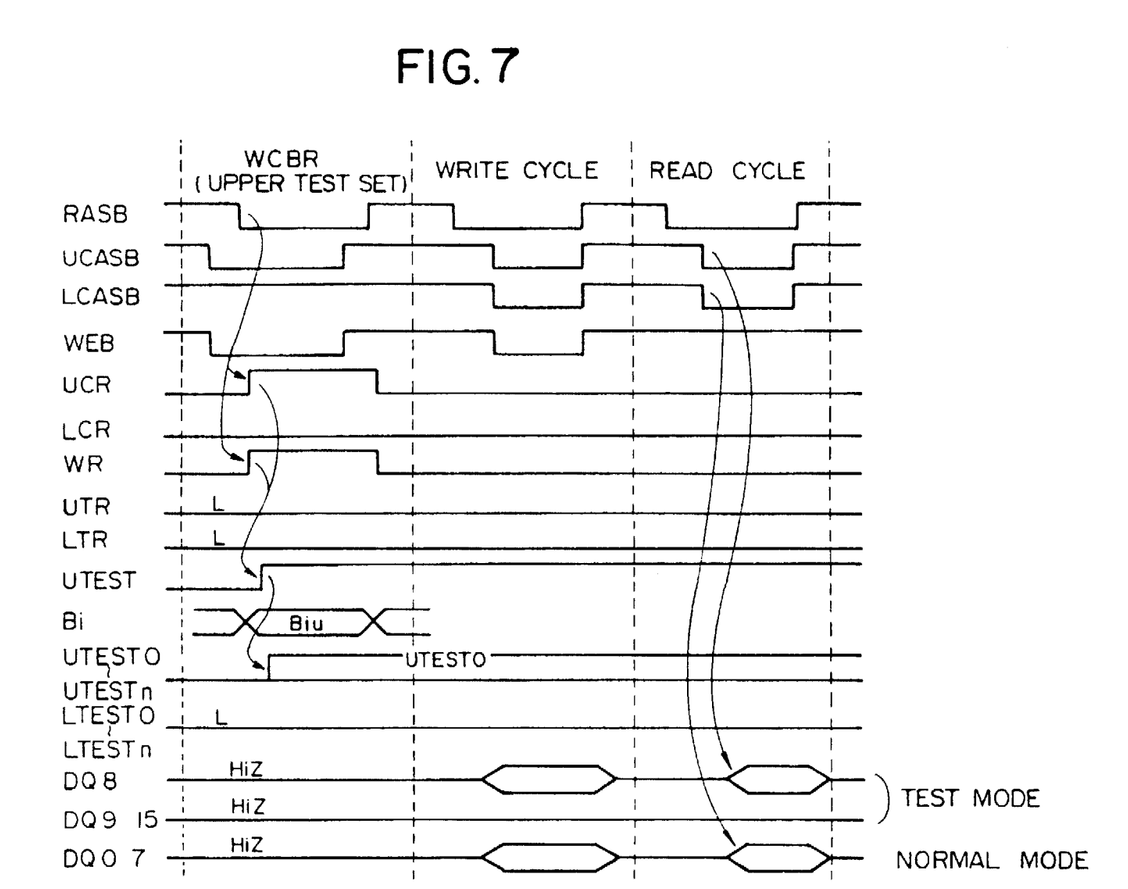
FIG. 7 shows a timing chart for illustrating other operations in the circuits of the embodiments of FIGS. 2 and 4.

FIG. 7 shows a timing chart for illustrating another operation of the circuit of the embodiments of FIGS. 2 and 4. In FIG. 7, the upper array is set to the compression mode (UTEST0) and the lower array is set to the normal mode.

In the first cycle, the upper array is set to the test mode UTEST0 by WCBR. Namely, the upper array is set to the compression test mode UTEST0 by the signals RASB, UCASB and WEB and the address Bju. In the first cycle, the signal LCASB for the lower array is left at the high level so that it is in the stand-by mode.

In the second cycle, a row address signal is read by the low level of the signal RASB and the signals UCASB and LCASB are rendered low level and a column address signal is read. The write circuit is enabled by the low level of the signal WEB. In the upper circuit, write data is supplied to the reduced bit DQ8 and the same data is written into other 7-bit memory cell. On the other hand, in the lower circuit, the data terminals DQ0–DQ7 are enabled and 8-bit data is written by the bit patterns supplied from the respective terminals.

In the third cycle, a row address signal is read by the low level of the signal RASB, and the signals UCASB and LCASB are rendered low level and a column address signal is read. The read circuit is enabled by the high level of the signal WEB. In the upper circuit, the read 8-bit data is compared by the data compression circuit CMPU and the match/mismatch bit which is compressed to one bit is supplied from the data terminal DQ8. During the first cycle to the third cycle, other data terminals DQ9–DQ15 are kept at high impedance HiZ. On the other hand, in the lower circuit, the data read from the data terminals DQ1–DQ7 are output.

By using the two-channel test control signals, the upper array and the lower array may be set in different modes. By using the present system, the correlation between the normal mode and the parallel test can be simultaneously evaluated. It is also applicable to various vendor tests which are not opened to the user.

Figure 8:
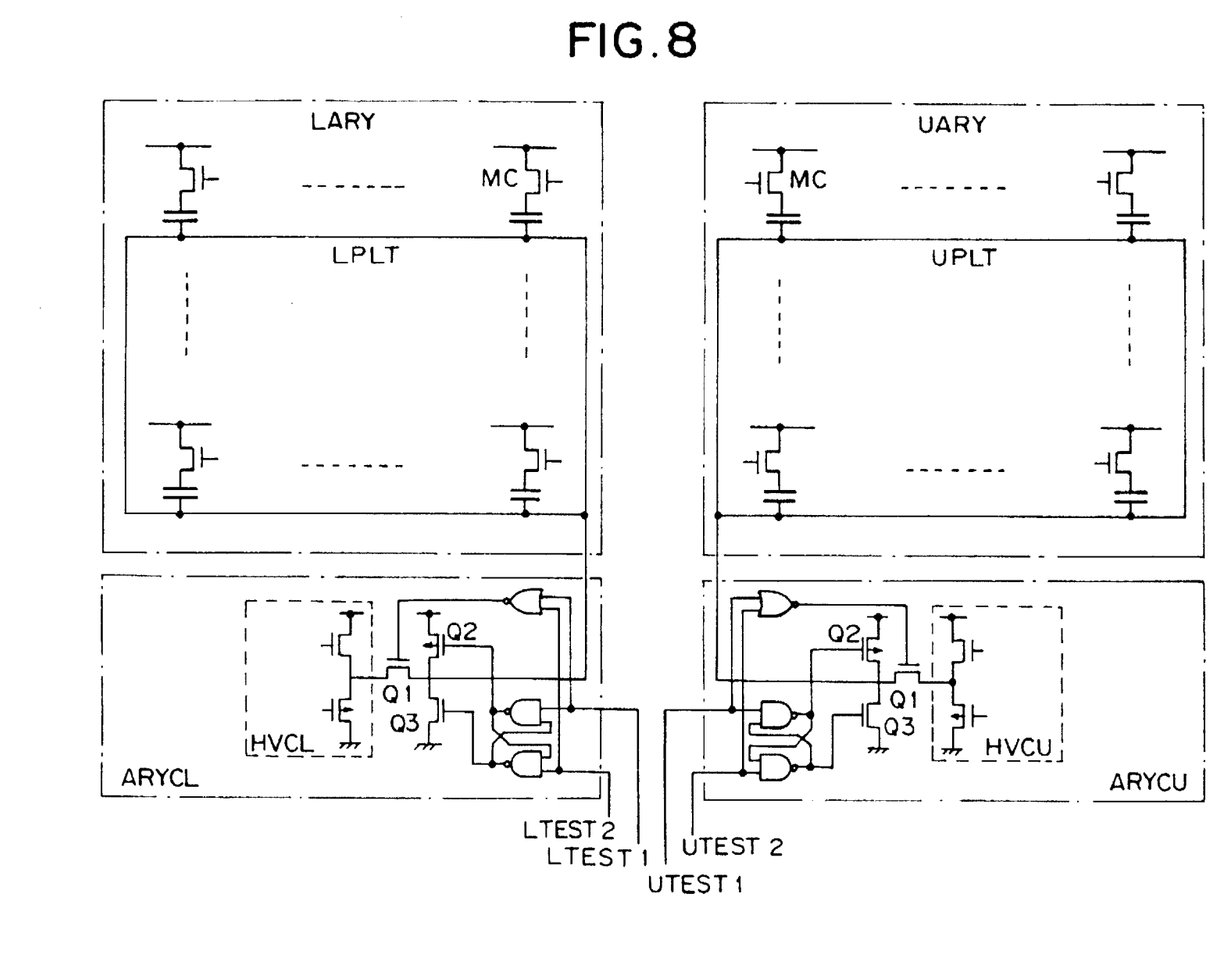
FIG. 8 shows a conceptual view for illustrating one embodiment of a test mode in accordance with the present invention.

FIG. 8 shows a conceptual view for illustrating one embodiment of the test mode of the present invention. The present embodiment is directed to a plate stress test used as a common electrode of a storage capacitor of the memory cell, and the plate stress test is conducted separately for the upper array and the lower array.

A plate potential of the memory cell is usually set to a mid-point potential such as VCC/2. This voltage is supplied by VCC/2 generation circuits HVCL and HVCU provided in array control units ARYCL and ARYCU. The dynamic RAM of the present embodiment has a test mode for fixing the plate voltages LPLT and UPLT to the power supply voltage VCC or the circuit ground potential VSS for the screening of an oxidization film of the memory cell capacitor and the reliability test, and it is independently controlled for the upper array and the lower array by the two-channel test function.

For example, in the upper array, the test mode signal UTESR1 is rendered high level and an output of a latched NAND gate is rendered low level by the low level of the test mode signal UTEST2 and a P-channel MOSFET Q2 is turned on to supply the power supply voltage VCC as the plate voltage UPLT. An output of a NOR gate is rendered low level by the high level of the test mode signal UTEST1 to turn off an N-channel MOSFET Q1 to stop the supply of the mid-point voltage VCC/2 generated by the VCC/2 voltage generation circuit HVCU.

In the lower circuit, the test mode signal LTESR2 is rendered high level as opposed to the upper circuit and the output of the latched NAND gate is rendered low level by the low level of the test mode signal LTEST1 to turn on an N-channel MOSFET Q3 to supply the circuit ground potential VSS as the plate voltage LPLT. The output of the NOR gate circuit is rendered low level by the high level of the test mode signal UTEST2 to turn off the N-channel MOSFET Q1 to stop the supply of the mid-point voltage VCC/2 generated by the VCC/2 voltage generation circuit HVCL.

By setting the upper and lower plate voltages UPLT/LPLT to VCC/VSS, voltage tests of samples of the same property to VCC and VSS may be conducted simultaneously so that test efficiency and test precision are improved.

By providing a test mode in which current paths for the upper and lower memory arrays are separated, a leakage current of the upper memory array and a leakage current of the lower memory array can be separately identified. Thus, when a leakage error occurs, it is possible to determine whether it is in the upper array or the lower array.

Not only the multi-bit test but also various test modes may be separately implemented to the memory such as the upper array and the lower array so that the delicate evaluation and analysis including test and defect analysis can be made with a smaller number of samples.

Figure 9:
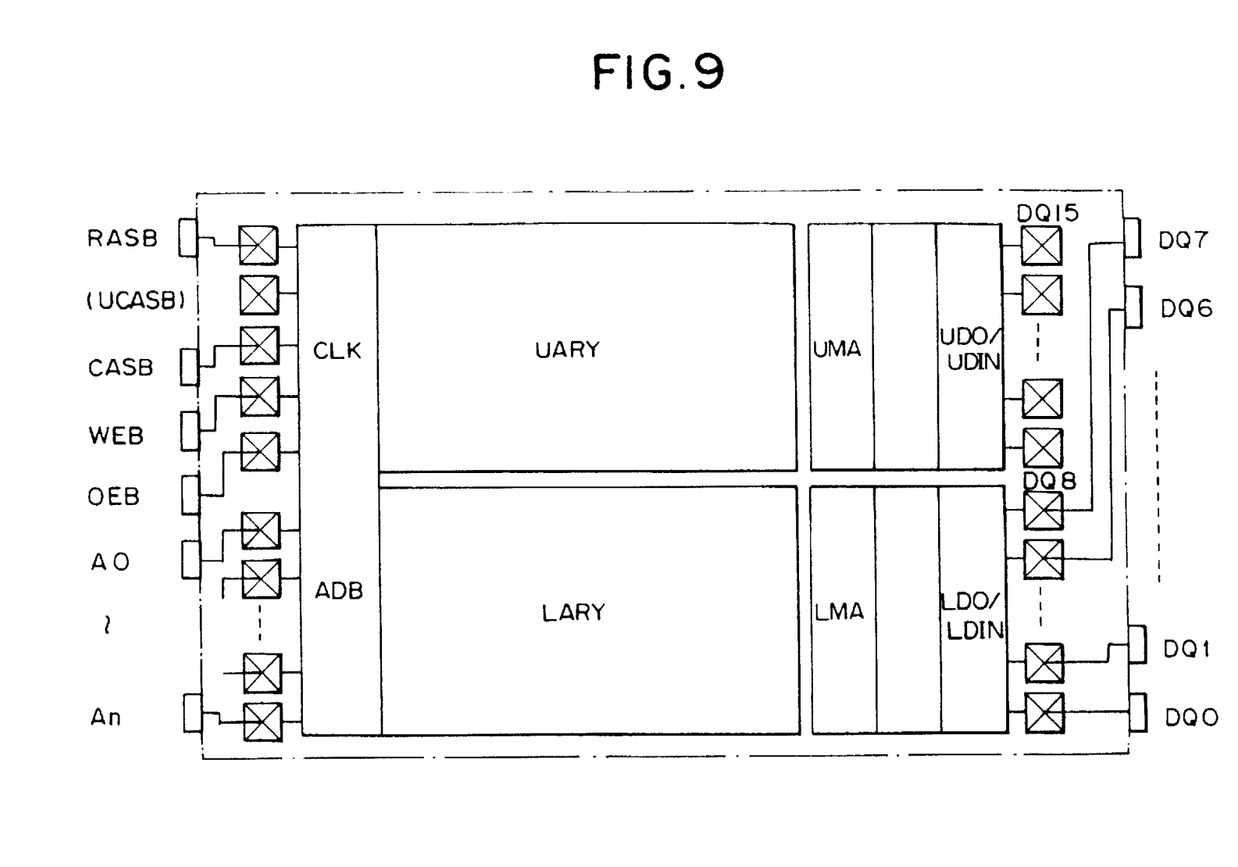
FIG. 9 shows a block diagram of one embodiment of the dynamic RAM of the present invention.

FIG. 9 shows a block diagram of an embodiment of the dynamic RAM of the present invention. An internal circuit is divided into an upper array UARY and a lower array LARY, and a main amplifier UMA and an input/output circuit UDO/UDIN are provided for the upper array UARY, and a main amplifier LMA and an input/output circuit LDO/LDIN are provided for the lower array LARY. Similarly, test modes can be separately and independently conducted for the respective arrays UARY and LARY.

In the dynamic RAM of the present embodiment, if there occurs a defect in only the upper array UARY, the lower array LARY may be used as a valid array so that it may be shipped as a partial chip configured dynamic RAM product. For example, when a memory capacity is approximately 64M bits (×16 bits) in total, it may be shipped as a 32M bits (×8 bits) product. When the total memory capacity is approximately 16M bits (×16 bits), it may be shipped as an 8M bits (×8 bits) product. In those partial chip configured products, the test mode opened to the user and the non-opened test mode can be implemented without modification because the test function is provided in the upper array UARY and the lower array LARY, respectively. The bit configuration may be versatile including 16 bits, 8 bits and 4 bits.

Figure 10:
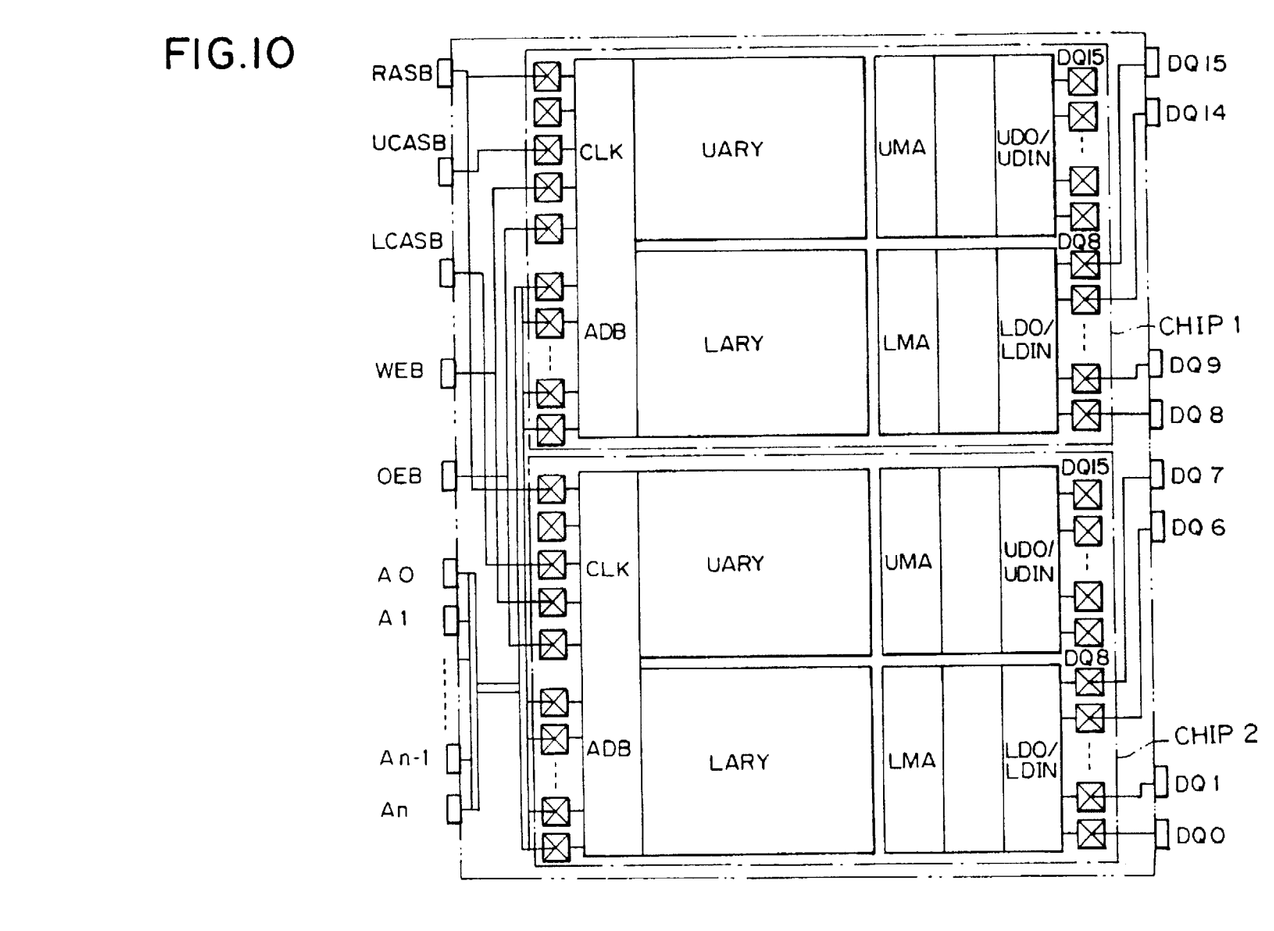
FIG. 10 shows a block diagram of other embodiment of the dynamic RAM of the present invention.

FIG. 10 shows a block diagram of other embodiment of the dynamic RAM of the present invention. The dynamic RAM of the present embodiment comprises two chips CHIP1 and CHIP2. Each of the chips CHIP1 and CHIP2 is partial chip having a defect in the upper array or the lower array as shown in the embodiment of FIG. 9. In the present embodiment, both upper arrays UARY include defects, and the lower arrays LARY are combined to construct a dynamic RAM which is equivalent to one good chip.

In this case, a current for the defect array may be blocked by bonding option so that a power consumption is rendered substantially equal to that of the one chip dynamic RAM. Since the test functions are provided for the upper arrays UARY and the lower arrays LARY in the two partial chips CHIP1 and CHIP2, the respective test circuits are operated by the column address strobe signals UCASB and LCASb supplied form external terminals, the test mode opened to the user and the non-opened test mode can be implemented without modification.

Figure 11:
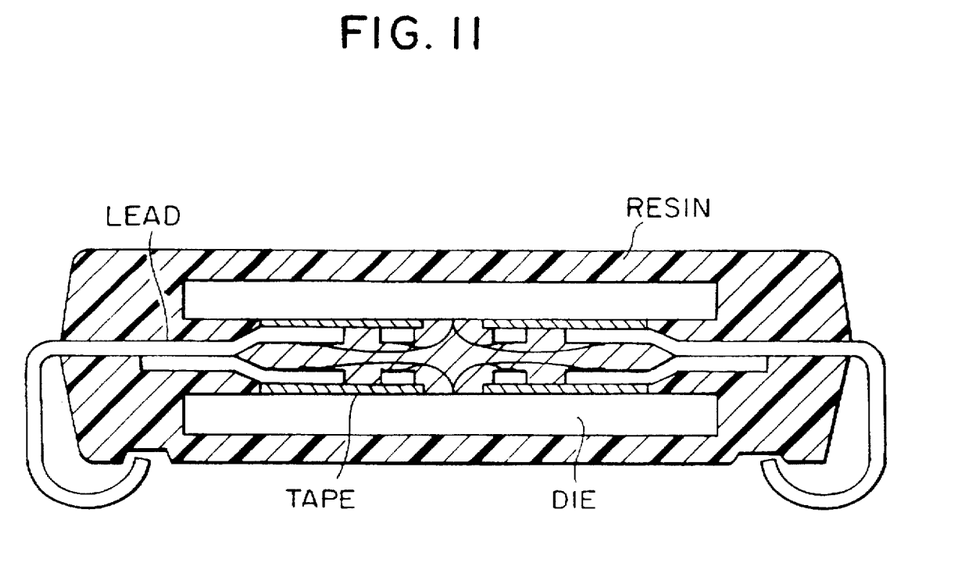
FIG. 11 shows a sectional view of the embodiment of the dynamic RAM shown in FIG. 10.

FIG. 11 shows a sectional view of the embodiment of the dynamic RAM shown in FIG. 10. In the present embodiment, two partial chips Die, as described above, are mounted face to face in a SOJ package (resin) by using LOC technology. It provide an apparent one chip good dynamic RAM product.

FIG. 12 shows a block diagram of another embodiment of the input/output unit of the dynamic RAM of the present invention. In the present embodiment, addresses for upper bits and lower bits are assigned to the input/output lines of the memory arrays in mutually adjacent manner. For example, the input/output lines of the memory arrays ARY0 and ARY1 are arranged in the order of IO0, IO8, IO1, IO9 so that the input/output lines IO8 and IO9 for the upper bits are offset to the input/output lines IO0 and IO1 for the lower bits.. The same manner is used for the input/output lines provided in the memory arrays.

The addresses allocated to the input/output lines are physically arranged to be adjacent between the lower bits and the upper bits, and data input selection circuits DIS0–DIS15, main amplifiers MA0–MA15 and data compression circuits CMPL and CMPU are provided for the respective input/output lines so that the upper bits and the lower bits are logically separated.

While not shown, the data terminals DQ1–DQ7 and DQ9–DQ15 are provided with data input buffers DIN1–DIN7 and DIN9–DIN15 and data output buffers DO1–DO7 and DO9–DO15 as they are in the embodiment of FIG. 4.

In the present embodiment, four pairs of output lines are alternately arranged in the upper array and the lower array so that the input/output line interference, which may raise a problem in a multi-bit dynamic RAM, may be checked. For example, low level (logical 0) is written to the even-numbered input/output lines and high level (logical 1) is written in the odd-numbered input/ output lined in the test mode so that a delay in the access time by the input/output line interference and an operation margin can be checked.

The technical advantages attained by the above embodiments are:

(1) The memory array is logically or physically divided into a plurality of blocks so that the test by block is permitted and delicate test and analysis of defect may be conducted with a smaller number of samples.

(2) A plurality of column address strobe signals are provided and, the memory access by plural bits is conducted to the memory array corresponding to the column address strobe signal and the test is conducted by using the column address strobe signal independently for each memory array. Accordingly, the operation paths and the logic in the normal mode may be used as they are and the test by block can be implemented by a simple configuration.

While the present invention has been specifically described based on the preferred embodiments thereof, the present invention should not be limited to those embodiments and it should be understood that various modifications and Change therefrom may be made without departing from the spirit and scope of the invention. For example, the division of the memory array may be made only logically as it is in the embodiment of FIG. 12. The actual arrangement of the memory arrays and the bit configurations may assume various forms. The test set and reset may be the combination of control signals such as WCBR or a combination of output enable signals OEB where they are available, or deducted test terminals may be provided if there is room in the terminals.

What is claimed is:

1. An address multiplex semiconductor memory device comprising:

a first memory array having a plurality of first memory cells;

a second memory array having a plurality of second memory cells;

a first terminal;

a second terminal;

a third terminal for receiving an input row address strobe signal;

a fourth terminal for receiving an input first column address strobe signal;

a fifth terminal for receiving an input second column address strobe signal;

a plurality of address terminals to which any of a plurality of row address signals, a plurality of first column address signals and a plurality of second column address signals are supplied;

a first data compression circuit having an output terminal coupled to said first terminal; and a second data compression circuit having an output terminal coupled to said second terminal, wherein said plurality of row address signals are input to an internal circuit coupled to said first memory array and said second memory array in accordance with said row address strobe signal, wherein said plurality of first column address signals are input to an internal circuit coupled to said first memory array in accordance with said first column address strobe signal, at least two of said plurality of first memory cells in said first memory array being selected in accordance with said row address signals and said plurality of first column address signals, wherein said plurality of second column address signals are input to an internal circuit coupled to said second memory array in accordance with said second column address strobe signal, at least two of said plurality of second memory cells in said second memory array being selected in accordance with said row address signals and said plurality of second column address signals, wherein said first data compression circuit receives a plurality of first read signals read out from said at least two of said plurality of first memory cells and outputs a first signal in accordance with said plurality of first read signals to said first terminal, and wherein said second data compression circuit receives a plurality of second read signals read out from said at least two of said plurality of second memory cells and outputs a second signal in accordance with said plurality of second read signals to said second terminal.

2. A semiconductor memory device according to claim 1, wherein said first data compression circuit outputs said first signal having a first level when each of said plurality of first read signals are the same logic level, wherein said first data compression circuit outputs said first signal having a second level when each of said plurality of first read signals are not the same logic level, wherein said second data compression circuit outputs said second signal having said first level when each of said plurality of second read signals are the same logic level, and wherein said second data compression circuit outputs said second signal having said second level when each of said plurality of second read signals are not the same logic level.

3. A semiconductor memory device according to claim 1, wherein said first data compression circuit and said second data compression circuit output said first signal and said second signal, respectively, when said semiconductor memory device is in a test mode.

4. A semiconductor memory device according to claim 1, wherein each of said plurality of first memory cells and each of said plurality of second memory cells is a dynamic type memory cell.

5. A semiconductor memory device according to claim 1, wherein said first terminal is a first data input/output terminal, and wherein said second terminal is a second data input/output terminal.

6. A semiconductor memory device according to claim 1, wherein said plurality of row address signals, said plurality of first column address signals and said plurality of second column address signals are supplied from outside of said device, and wherein said row address strobe signal, said first column address strobe signal and said second column address strobe signal are input from outside of said device, wherein said first signal and said second signal are output to outside of said device.

* * * * *